(12) United States Patent
Zhao et al.

(10) Patent No.: US 12,199,228 B2
(45) Date of Patent: Jan. 14, 2025

(54) DISPLAY PANEL, MANUFACTURING METHOD THEREOF, AND BONDING STRUCTURE

(71) Applicant: SHENZHEN CHINA STAR OPTOELECTRONICS SEMICONDUCTOR DISPLAY TECHNOLOGY CO., LTD., Guangdong (CN)

(72) Inventors: Jinyang Zhao, Guangdong (CN); Dongze Li, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/609,734

(22) PCT Filed: Sep. 18, 2021

(86) PCT No.: PCT/CN2021/119259
§ 371 (c)(1),
(2) Date: Nov. 8, 2021

(87) PCT Pub. No.: WO2023/035315
PCT Pub. Date: Mar. 16, 2023

(65) Prior Publication Data
US 2024/0030396 A1    Jan. 25, 2024

(30) Foreign Application Priority Data
Sep. 10, 2021   (CN) .......................... 202111061859.X

(51) Int. Cl.
*H01L 33/62*       (2010.01)
*H01L 25/075*     (2006.01)

(52) U.S. Cl.
CPC .......... *H01L 33/62* (2013.01); *H01L 25/0753* (2013.01); *H01L 2933/0066* (2013.01)

(58) Field of Classification Search
CPC ................. H01L 33/62; H01L 25/0753; H01L 2933/0066
See application file for complete search history.

(56) References Cited

U.S. PATENT DOCUMENTS

| 10,236,324 B1 | 3/2019 | Do et al. |
| 2017/0138549 A1 | 5/2017 | Do et al. |
| (Continued) | | |

FOREIGN PATENT DOCUMENTS

| CN | 106178271 A | 12/2016 |
| CN | 106206611 A | 12/2016 |
| (Continued) | | |

OTHER PUBLICATIONS

Chinese Office Action issued in corresponding Chinese Patent Application No. 202111061859.X dated Jun. 3, 2023, pp. 1-9.
(Continued)

*Primary Examiner* — Sonya McCall-Shepard
(74) *Attorney, Agent, or Firm* — PV IP PC; Wei Te Chung

(57) ABSTRACT

A display panel, a manufacturing method thereof, and a bonding structure are provided. The display panel includes a first body electrode and a second body electrode disposed on a same layer on a substrate and disposed oppositely. A first conductive electrode is disposed on the first body electrode. A light-emitting device includes a first lead and a second lead disposed opposite to each other. The first lead is disposed to contact the first body electrode and the first conductive electrode. The second lead contacts the second body electrode.

20 Claims, 9 Drawing Sheets

(56) References Cited

U.S. PATENT DOCUMENTS

| | | | |
|---|---|---|---|
| 2017/0200859 A1 | 7/2017 | Do et al. | |
| 2017/0229608 A1* | 8/2017 | Wu | ............ H01L 33/38 |
| 2019/0088707 A1 | 3/2019 | Do et al. | |

FOREIGN PATENT DOCUMENTS

| | | | |
|---|---|---|---|
| CN | 106711304 A | 5/2017 |
| CN | 107170880 A | 9/2017 |
| CN | 107509284 A | 12/2017 |
| CN | 207213728 U | 4/2018 |
| CN | 207352908 U | 5/2018 |
| CN | 109103176 A | 12/2018 |
| CN | 109863831 A | 6/2019 |
| CN | 111584761 A | 8/2020 |
| CN | 112542536 A | 3/2021 |
| CN | 112877740 A | 6/2021 |
| CN | 113035854 A | 6/2021 |
| JP | H0567765 A | 3/1993 |
| WO | 2020238173 A1 | 12/2020 |
| WO | 2021110332 A1 | 6/2021 |

OTHER PUBLICATIONS

International Search Report in International application No. PCT/CN2021/119259, mailed on Jun. 7, 2022.
Written Opinion of the International Search Authority in International application No. PCT/CN2021/119259, mailed on Jun. 7, 2022.

* cited by examiner

DISPLAY PANEL, MANUFACTURING METHOD THEREOF, AND BONDING STRUCTURE

RELATED APPLICATIONS

This application is a Notional Phase of PCT Patent Application No. PCT/CN2021/119259 having international filing date Sep. 18, 2021, which claims the benefit of priority of Chinese Patent Application No. 202111061859.X filed on Sep. 10, 2021. The contents of the above applications are all incorporated by reference as if fully set forth herein in their entirety.

FIELD OF INVENTION

The present application is related to the field of display technology and specifically to a display panel, a manufacturing method thereof, and a bonding structure.

BACKGROUND OF INVENTION

As indispensable essential units in the field of optoelectronic devices, patterned electrodes are widely used in various optoelectronic devices, such as touch screens, sensors, solar cells, light-emitting diodes, thin film transistors, etc. Currently, components to be bonded are usually transferred to the patterned electrodes, such as micro-nano light-emitting diodes (micro-nano LEDs) or micro-LED devices. In a process of transferring the micro-nano LEDs or the micro-LED devices, the micro-nano LEDs or the micro-LED devices are not in good contact with the patterned electrodes, which results in a failure of lighting the micro-nano LEDs or the micro-LED devices, thereby affecting a display effect of a device, which further affects a performance of the device.

SUMMARY OF INVENTION

The present application provides a display panel and a manufacturing method thereof, and a bonding structure and a manufacturing method thereof which can solve a technical problem of a bad contact issue between a conventional light-emitting device and patterned electrodes.

The present application provides a display panel, including:
  a substrate;
  a first body electrode disposed on the substrate;
  a first conductive electrode disposed on the first body electrode;
  a second body electrode disposed on the substrate and opposite to the first body electrode; and
  a light-emitting device including a first lead and a second lead opposite to the first lead, the first lead being disposed between the first conductive electrode and the first body electrode and contacting the first body electrode and the first conductive electrode, and the second lead being disposed on the second body electrode and contacting the second body electrode.

Optionally, in an embodiment of the present application, the display panel further includes a second conductive electrode disposed on the second body electrode; the second lead of the light-emitting device being disposed between the second body electrode and the second conductive electrode and contacting the second body electrode and the second conductive electrode.

Optionally, in an embodiment of the present application, the first body electrode includes a first electrode portion and a second electrode portion connected to the first electrode portion. The first conductive electrode is disposed on the second electrode portion. The second body electrode includes a third electrode portion and a fourth electrode portion connected to the third electrode portion, and the second conductive electrode is disposed on the fourth electrode portion. The first electrode portion is opposite to the third electrode portion. The second electrode portion and the fourth electrode portion are disposed between the first electrode portion and the third electrode portion. The first lead is disposed between the second electrode portion and the first conductive electrode, and the second lead is disposed between the fourth electrode portion and the second conductive electrode.

Optionally, in an embodiment of the present application, the first conductive electrode includes at least two first conductive patterns. Two adjacent first conductive patterns are spaced apart. One of the first conductive patterns is connected to the first lead. The second conductive electrode includes at least two second conductive patterns. Two adjacent second conductive patterns are spaced apart. One of the second conductive patterns is connected to the second lead.

Optionally, in an embodiment of the present application, the first conductive electrode further includes a third conductive pattern positioned between the two adjacent first conductive patterns. A width of the one of the first conductive patterns is greater than a width of the third conductive pattern. The second conductive electrode further includes a fourth conductive pattern positioned between the two adjacent second conductive patterns. A width of the one of the second conductive patterns is greater than a width of the fourth conductive pattern.

Optionally, in an embodiment of the present application, the first body electrode and the second body electrode include a plurality of electrode portions arranged at intervals. One of the first conductive patterns is disposed on one of the electrode portions of the first body electrode. The second body electrode includes a plurality of third electrode portions and a plurality of fourth electrode portions arranged at intervals. One of the second conductive patterns is disposed on one of the electrode portions of the second body electrode. The electrode portions of the first body electrode are opposite to the electrode portions of the second body electrode.

Optionally, in an embodiment of the present application, the first conductive electrode and the second conductive electrode are conductive films, and one of the conductive films includes a conductive nanomaterial.

Optionally, in an embodiment of the present application, the conductive nanomaterial includes one or a combination of gold, silver, copper, iron, aluminum, polyaniline, polypyrrole, carbon nanotubes, or graphene.

Optionally, in an embodiment of the present application, vertical cross-section thicknesses of the first conductive electrode and the second conductive electrode range from 10 nanometers to 50 micrometers.

Optionally, in an embodiment of the present application, a distance between the first body electrode provided with the first conductive electrode and the second body electrode provided with the second conductive electrode is less than 100 nanometers.

The present application further provides a manufacturing method of a display panel, including:
  providing a substrate;

forming a first body electrode and a second body electrode on the substrate;
providing a light-emitting device, the light-emitting device including a first lead and a second lead opposite to the first lead, the first lead being disposed on the first body electrode, the second lead being disposed on the second body electrode, and the second lead contacting the second body electrode;
depositing conductive electrode material on the first body electrode, the second body electrode, and the light-emitting device, and the conductive electrode material including a conductive nanomaterial; and
applying a voltage to the first body electrode and the second body electrode to form a first electric field, forming a first conductive electrode with the conductive nanomaterial, the first conductive electrode covering the first lead and the first body electrode, and the first lead contacting the first body electrode and the first conductive electrode.

Optionally, in an embodiment of the present application, the first body electrode and the second body electrode are positioned on a first plane. The step of applying the voltage to the first body electrode and the second body electrode to form the first electric field, forming the first conductive electrode with the conductive nanomaterial, the first conductive electrode covering the first lead and the first body electrode, and the first lead contacting the first body electrode and the first conductive electrode includes:
applying the voltage to the first body electrode and the second body electrode to form a second electric field, forming a second conductive electrode with the conductive nanomaterial, the second conductive electrode covering the second lead and the second body electrode, and directions of the first electric field and the second electric field being opposite.

Optionally, in an embodiment of the present application, the step of applying the voltage to the first body electrode and the second body electrode to form the first electric field, forming the first conductive electrode with the conductive nanomaterial, the first conductive electrode covering the first lead and the first body electrode, and the first lead contacting the first body electrode and the first conductive electrode includes:
providing a pair of electrodes, an orthographic projection of the pair of electrodes on the substrate covering an orthographic projection of the first body electrode and the second body electrode on the substrate, the first body electrode and the second body electrode being positioned on a first plane, the pair of electrodes being positioned on a second plane, and the first plane and the second plane being opposite; and
applying the voltage to the first body electrode, the second body electrode, and the pair of electrodes to form a third electric field, forming the first conductive electrode and a second conductive electrode with the conductive nanomaterial, the first conductive electrode covering the first lead and the first body electrode, and the second conductive electrode covering the second lead and the second body electrode.

Optionally, in an embodiment of the present application, the step of applying the voltage to the first body electrode, the second body electrode, and the pair of electrodes to form the third electric field, forming the first conductive electrode and the second conductive electrode with the conductive nanomaterial, the first conductive electrode covering the first lead and the first body electrode, and the second conductive electrode covering the second lead and the second body electrode includes:
providing an additional electrode and a sacrificial electrode, the additional electrode and the sacrificial electrode being positioned on the second plane, and the additional electrode and the sacrificial electrode being spaced apart;
applying the voltage to the first body electrode, the second body electrode, the additional electrode, and the sacrificial electrode to form the third electric field, forming the first conductive electrode and the second conductive electrode with the conductive nanomaterial, an orthographic projection of the additional electrode on the substrate covering an orthographic projection of the first conductive electrode on the substrate, and an orthographic projection of the sacrificial electrode on the substrate covering an orthographic projection of the second conductive electrode on the substrate.

The present application further provides a bonding structure, includes:
a substrate;
a first body electrode disposed on the substrate;
a first conductive electrode disposed on the first body electrode;
a second body electrode disposed on the substrate and opposite to the first body electrode; and
a component to be bonded including a first lead and a second lead opposite to the first lead, the first lead being disposed between the first conductive electrode and the first body electrode and contacts the first body electrode and the first conductive electrode, and the second lead being disposed on the second body electrode and contacts the second body electrode.

Optionally, in an embodiment of the present application, a concentration of a solution containing the conductive nanomaterial ranges from 1 milligram per milliliter to 200 milligrams per milliliter.

Optionally, in an embodiment of the present application, an electric field intensity of the first electric field is greater than 0 V/um and less than 50 V/um.

Optionally, in an embodiment of the present application, a time of applying the voltage ranges from 1 second to 100 seconds.

Optionally, in an embodiment of the present application, after the step of applying the voltage to the first body electrode and the second body electrode to form the first electric field and forming the first conductive electrode with the conductive nanomaterial, the manufacturing method of the display panel further includes:
annealing the first conductive electrode.

Optionally, in an embodiment of the present application, after the step of applying the voltage to the first body electrode and the second body electrode to form the second electric field, forming the second conductive electrode with the conductive nanomaterial, the manufacturing method of the display panel further includes:
annealing the second conductive electrode.

The application provides the display panel, the manufacturing method thereof, and the bonding structure. The display panel includes the substrate, the first body electrode, the first conductive electrode, the second body electrode, and the light-emitting device. The first body electrode is disposed on the substrate. The first conductive electrode is disposed on the first body electrode. The second body electrode is disposed on the substrate. The second body electrode is opposite to the first body electrode. The light-emitting device includes the first lead and the second lead arranged opposite to the first lead. The first lead is disposed between the first conductive electrode and the first body electrode, and the first lead is disposed on the first conductive electrode and contacts the first body electrode. The second lead is disposed on the second body electrode, and the second lead contacts the second body electrode. The light-emitting device is bonded to the first body electrode through the first conductive electrode, which enhances a contact between the light-emitting device and the first body electrode, thereby enhancing a performance of the display panel.

DESCRIPTION OF DRAWINGS

In order to describe technical solutions in the present application clearly, drawings to be used in the description of embodiments will be described briefly below. Obviously, drawings described below are only for some embodiments of the present application, and other drawings can be obtained by those skilled in the art based on these drawings without creative efforts.

DETAILED DESCRIPTION OF EMBODIMENTS

The technical solution of the present application embodiment will be clarified and completely described with reference accompanying drawings in embodiments of the present application embodiment. Obviously, the present application described parts of embodiments instead of all of the embodiments. Based on the embodiments of the present application, other embodiments which can be obtained by a skilled in the art without creative efforts fall into the protected scope of the of the present application. In addition, it should be understood that specific implementations described here are only used to illustrate and explain the present application and are not used to limit the present application. In the present application, if no explanation is made to the contrary, orientation words such as "upper" and "lower" usually refer to upper and lower directions of a device in an actual use or a working state and specifically refer to drawing directions in drawings. Also, "inner" and "outer" refer to an outline of the device. In the present application, a "reaction" can be a chemical reaction or a physical reaction.

Embodiments of the present application provide a display panel and a manufacturing method thereof, and a bonding structure and a manufacturing method thereof. Detailed descriptions are respectively given below.

The present application provides a display panel. The display panel includes a substrate, a first body electrode, a first conductive electrode, a second body electrode, and a light-emitting device. The first body electrode is disposed on the substrate, and the first conductive electrode is disposed on the first body electrode. The second body electrode is disposed on the substrate. The second body electrode is disposed opposite to the first body electrode. The light-emitting device includes a first lead and a second lead disposed opposite to the first lead. The first lead is disposed between the first conductive electrode and the first body electrode, and the first lead contacts the first conductive electrode and contacts the first body electrode. The second lead is disposed on the second body electrode, and the second lead contacts the second body electrode.

In the present application, the light-emitting device is bonded to the first body electrode through the first conductive electrode, which enhances a contact between the light-emitting device and the first body electrode, thereby enhancing a performance of the display panel.

The display panel provided by the present application will be described in detail below through specific embodiments.

Figure 1:
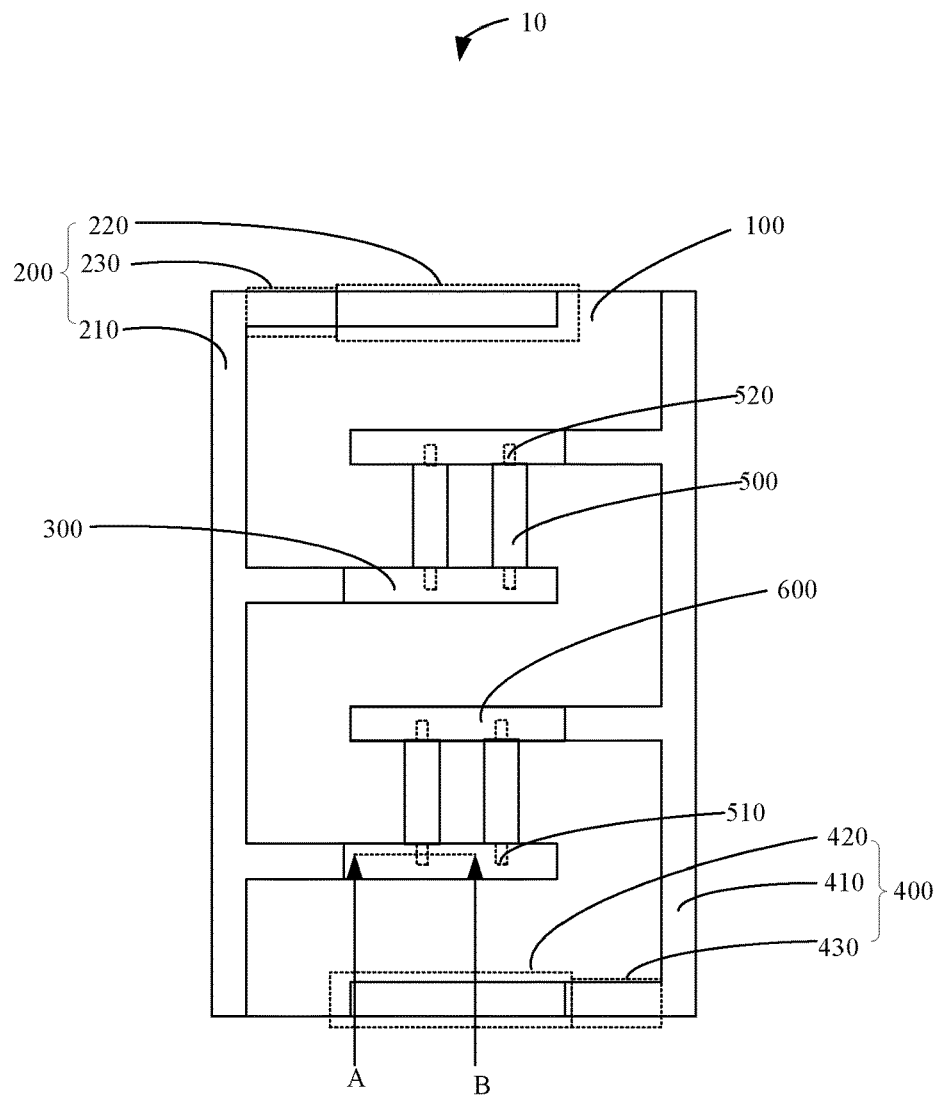
FIG. 1 is a first type of planar structural schematic diagram of a display panel provided by an embodiment of the present application.
Figure 2:
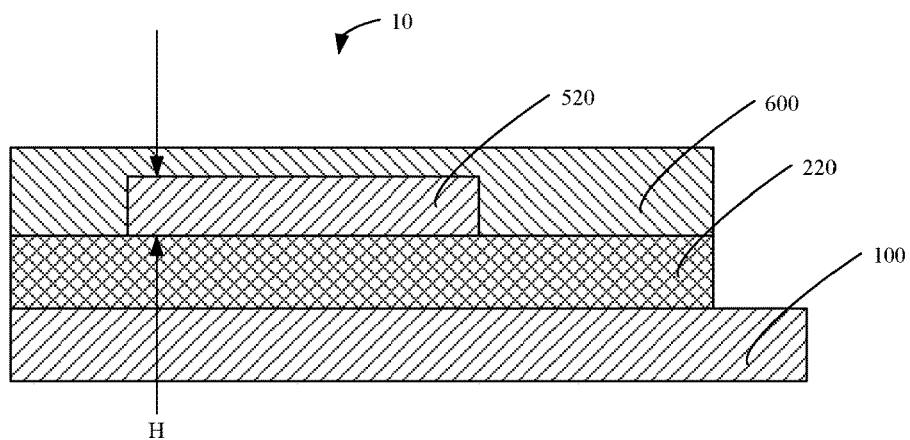
FIG. 2 is a structural schematic diagram of the display panel along a line AB as shown in FIG. 1.

References are made to FIG. 1 and FIG. 2. FIG. 1 is a first type of planar structural schematic diagram of a display panel provided by an embodiment of the present application. FIG. 2 is a structural schematic diagram of the display panel along a line AB as shown in FIG. 1.

A substrate 100 is a rigid substrate or a flexible substrate. The rigid substrate can be made of glass. The flexible substrate can be made of polymer materials, such as polyimide (PI), polycarbonate (PC), polyethersulfone (PES), polyethylene terephthalate (PET), polyethylene naphthalate (PEN), polyarylate (PAR), glass fiber reinforced plastic (FRP), etc.

A first body electrode 200 is disposed on the substrate 100. The first body electrode 200 includes a first electrode portion 210 and a second electrode portion 220 connected to the first electrode portion 210. A first conductive electrode 300 is disposed on the second electrode portion 220. An orthographic projection of the first conductive electrode 300 on the substrate 100 completely covers an orthographic projection of the second electrode portion 220 on the substrate 100, and they overlap on edges. A light-emitting device 500 includes a first lead 510 and a second lead 520 disposed opposite to the first lead 510. The first lead 510 is disposed between the second electrode portion 220 and the first conductive electrode 300, and the first lead 510 contacts the first conductive electrode 300 and contacts the first body electrode 200. The second lead 520 is disposed on a second body electrode 400, and the second lead 520 contacts the second body electrode 400. The light-emitting device 500 can be a micro light-emitting diode or a micro-nano light-emitting diode.

In an embodiment, the first electrode portion 210 and the second electrode portion 220 are perpendicular to each other.

In an embodiment, the first body electrode 200 further includes a first connecting portion 230. The first connecting portion 230 is connected to the first electrode portion 210 and the second electrode portion 220, and both the first connecting portion 230 and the second electrode portion 220 are perpendicular to the first electrode portion 210.

In the present application, the first conductive electrode 300 covers the first lead 510 and the second electrode portion 220 of the light-emitting device 500, and the first lead 510 contacts the first conductive electrode 300 and the first body electrode 200, thereby enhancing a contacting performance of the first lead 510 and the second electrode portion 220, so as to prevent the light-emitting device 500 from being unable to light up, thereby enhancing a light emitting effect and a stability of a display panel 10, and further enhancing a performance of the display panel 10.

In an embodiment, the second body electrode 400 includes a third electrode portion 410 and a fourth electrode portion 420 connected to the third electrode portion 410. A second conductive electrode 600 is disposed on the fourth electrode portion 420. An orthographic projection of the second conductive electrode 600 on the substrate 100 completely covers an orthographic projection of the fourth electrode portion 420 on the substrate 100, and they overlap on edges. Edges of the orthographic projection of the second conductive electrode 600 on the substrate 100 overlap edges of the orthographic projection of the fourth electrode portion 420 on the substrate 100. The first electrode portion 210 and the third electrode portion 410 are disposed opposite to each other. The second electrode portion 220 and the fourth electrode portion 420 are disposed between the first electrode portion 210 and the third electrode portion 410. The second lead 520 is disposed between the fourth electrode portion 420 and the second conductive electrode 600, and the second lead 520 contacts the fourth electrode portion 420 and the second conductive electrode 600.

In an embodiment, the third electrode portion 410 and the fourth electrode portion 420 are perpendicular to each other.

In an embodiment, the second body electrode 400 further includes a second connecting portion 430. The second connecting portion 430 is connected to the third electrode portion 410 and the fourth electrode portion 420, and both the second connecting portion 430 and the third electrode portion 410 perpendicular to the fourth electrode portion 420. That is to say, the first body electrode 200 and the second body electrode 400 are interdigital electrodes.

In the present application, through the second conductive electrode 600 being covered on the second lead 520 and the second body electrode 400, a conductivity among the light-emitting device 500 and the first body electrode 200 and the second body electrode 400 is thereby enhanced, and a displaying effect of the display panel 10 is thereby further enhanced, thereby enhancing the performance of the display panel 10.

In an embodiment, the first conductive electrode 300 and the second conductive electrode 600 are both conductive films. A material of the conductive films is a conductive nanomaterial. The conductive nanomaterial includes one or a combination of gold, silver, copper, iron, aluminum, polyaniline, polypyrrole, carbon nanotubes, or graphene.

In an embodiment, a material of the first body electrode 200 and the second body electrode 400 is the same as a material of the first conductive electrode 300 and the second conductive electrode 600, i.e., the conductive nanomaterial.

In the present application, the conductive nanomaterial is adopted to form the first conductive electrode 300 and the second conductive electrode 600, so that an electrodeposition method can be adopted subsequently to form the first conductive electrode 300 and the second conductive electrode 600, which has a simple process, and solvents used in a flow of the process and ultraviolet light do not easily damage a stability of the light-emitting device 500 and enhance an accuracy, thereby enhancing the performance of the display panel 10.

In an embodiment, a vertical cross-sectional thickness H of the first conductive electrode 300 and the second conductive electrode 600 both range from 10 nanometers to 50 micrometers. Specifically, the vertical cross-sectional thickness H of the first conductive electrode 300 and the second conductive electrode 600 can be 10 nanometers, 100 nanometers, 500 nanometers, 900 nanometers, 1 micrometer, 10 micrometers, 30 micrometers, micrometers, 50 micrometers, etc.

In the present application, the vertical cross-sectional thickness H of the first conductive electrode 300 and the second conductive electrode 600 is arranged to range from 10 nanometers to 50 micrometers, which enhances the conductivity among the light-emitting device 500 and the first body electrode 200 and the second body electrode 400 and enhances the display effect of the display panel 10, thereby enhancing the performance of the display panel 10, and reducing a cost.

In an embodiment, a distance between the first body electrode 200 provided with the first conductive electrode 300 and the second body electrode 400 provided with the second conductive electrode 600 is less than 100 nanometers. Specifically, the distance between the first body electrode 200 provided with the first conductive electrode 300 and the second body electrode 400 provided with the second conductive electrode 600 can be less than 10 nanometers, 50 nanometers, 70 nanometers, 80 nanometers, 90 nanometers, etc. In the present application, the distance between the first body electrode 200 provided with the first conductive electrode 300 and the second body electrode 400 provided with the second conductive electrode 600 is arranged to be less than 100 nanometers to ensure a quality of film formation and prevent an electric field from being too weak to form the first conductive electrode 300 and the second conductive electrode 300 through adopting the electrodeposition method to form the first conductive electrode 300 and the second conductive electrode 300, due to the distance between the first body electrode 200 and the second body electrode 400 being too far, and causing uneven film thicknesses, thereby enhancing the performance of the display panel 10.

Figure 3:
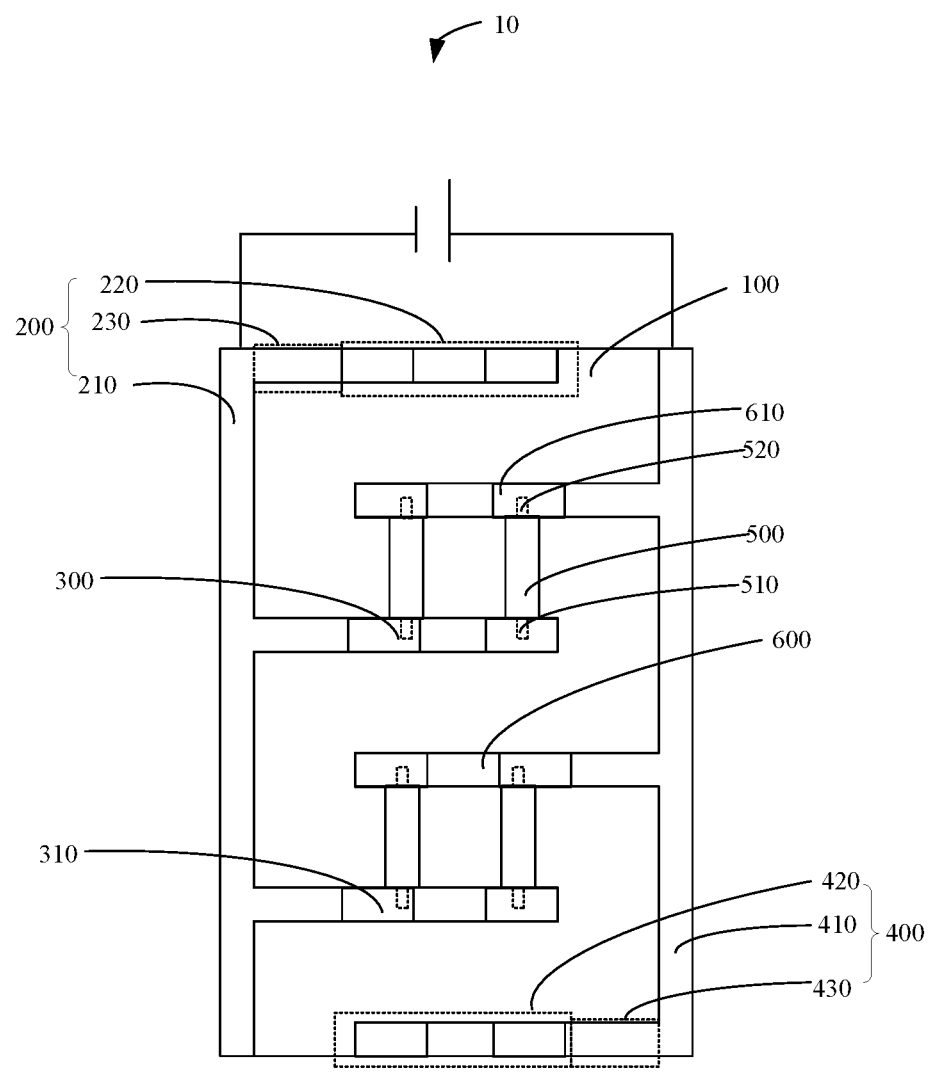
FIG. 3 is a second type of planar structural schematic diagram of the display panel provided by an embodiment of the present application.

Referring to FIG. 3, FIG. 3 is a second type of planar structural schematic diagram of the display panel provided by an embodiment of the present application. It should be noted that a difference between a second type of structure and a first structure is:

An orthographic projection of the first conductive electrode 300 on the substrate 100 does not completely cover an orthographic projection of the second electrode portion 220 on the substrate 100. An orthographic projection of the second conductive electrode 600 on the substrate 100 does not completely cover an orthographic projection of the fourth electrode portion 420 on the substrate 100. The first conductive electrode 300 includes at least two first conductive patterns 310. Each two adjacent first conductive patterns 310 are spaced apart. The first conductive patterns 310 are disposed on the second electrode portion 220. The first lead 510 is disposed between a first conductive pattern 310 and the second electrode portion 220, and the first lead 510 contacts the first conductive pattern 310 and the second electrode portion 220. An orthographic projection of the first conductive pattern 310 on the substrate 100 is within the orthographic projection of the second electrode portion 220 on the substrate 100. The second conductive electrode 600 includes at least two second conductive patterns 610. Each two adjacent second conductive patterns 610 are spaced apart. An orthographic projection of a second conductive pattern 610 on the substrate 100 is within the orthographic projection of the fourth electrode portion 420 on the substrate 100. The second conductive patterns 610 are disposed on the fourth electrode portion 420. The second lead 520 is disposed between the second conductive pattern 610 and the fourth electrode portion 420, and the second lead 520 contacts the second conductive pattern 610 and the fourth electrode portion 420.

In the present application, each two adjacent first conductive patterns 310 are spaced apart and each two adjacent second conductive patterns 610 are spaced apart to prevent waste of materials, thereby reducing the cost, increasing a pixel light-emitting area formed by the light-emitting device 500 and other structures, and further enhances the display effect of the display panel 10, thereby enhancing the performance of the display panel 10.

Figure 4:
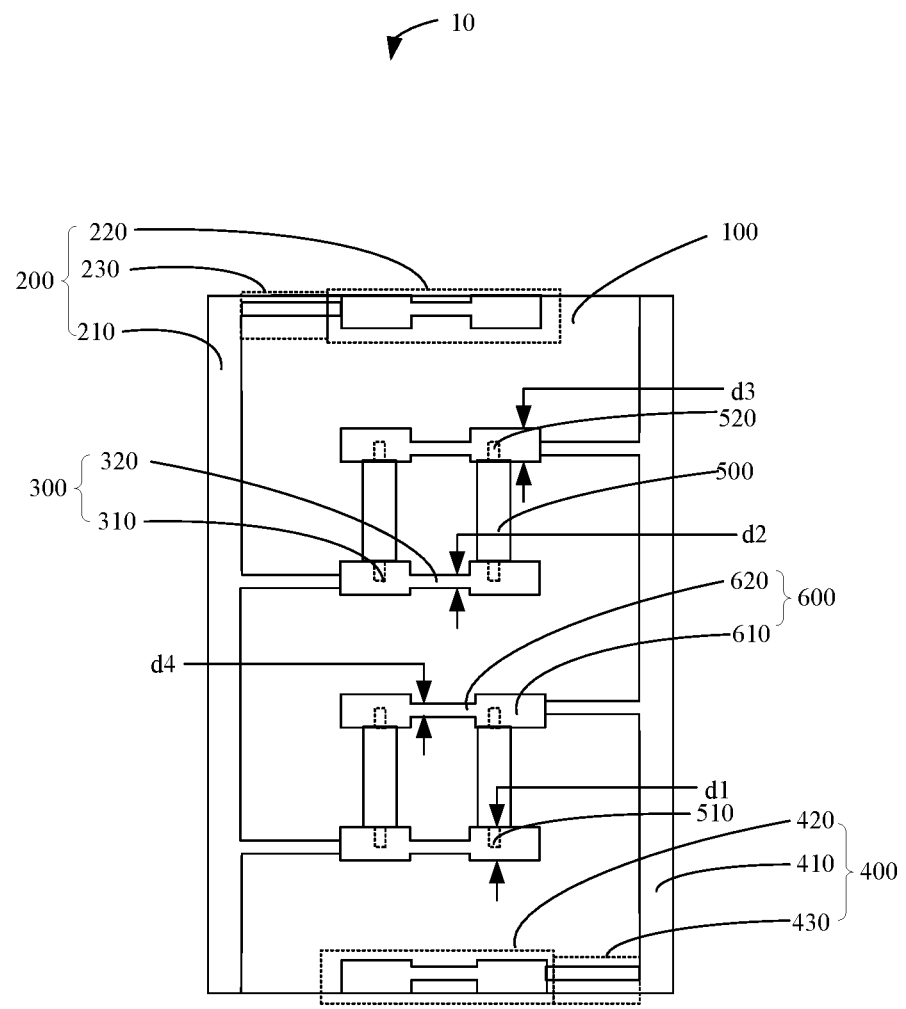
FIG. 4 is a third type of planar structural schematic diagram of the display panel provided by an embodiment of the present application.

Referring to FIG. 4, FIG. 4 is a third type of planar structural schematic diagram of the display panel provided by an embodiment of the present application. It should be noted that a difference between a third type of structure and the second type of structure is:

Specifically, the first conductive electrode 300 further includes a third conductive pattern 320. The third conductive pattern 320 is positioned between two adjacent ones of the first conductive patterns 310. A width d1 of the first conductive pattern 310 is greater than a width d2 of the third conductive pattern 320. The second conductive electrode 600 further includes a fourth conductive pattern 620. The fourth conductive pattern 620 is positioned between two adjacent ones of the second conductive patterns 610. A width d3 of the second conductive pattern 610 is greater than a width d4 of the fourth conductive pattern 620. The first conductive pattern 310 is disposed opposite to the second conductive pattern 610 or the fourth conductive pattern 620.

In the present application, the first conductive electrode 300 is formed by the first conductive pattern 310 and the third conductive pattern 320, and the second conductive electrode 600 is formed by the second conductive pattern 610 and the fourth conductive pattern 620. The width d1 of the first conductive pattern 310 is further arranged to be greater than the width d2 of the third conductive pattern 320, and the width d3 of the second conductive pattern 610 is arranged to be greater than the width d4 of the fourth conductive pattern 620 to prevent blocking of the pixel light-emitting area formed by the light-emitting device 500 and other structures, thereby increasing an opening ratio of pixels, further enhancing the display effect of the display panel 10, enhancing the performance of the display panel 10, and reducing the cost.

Figure 5:
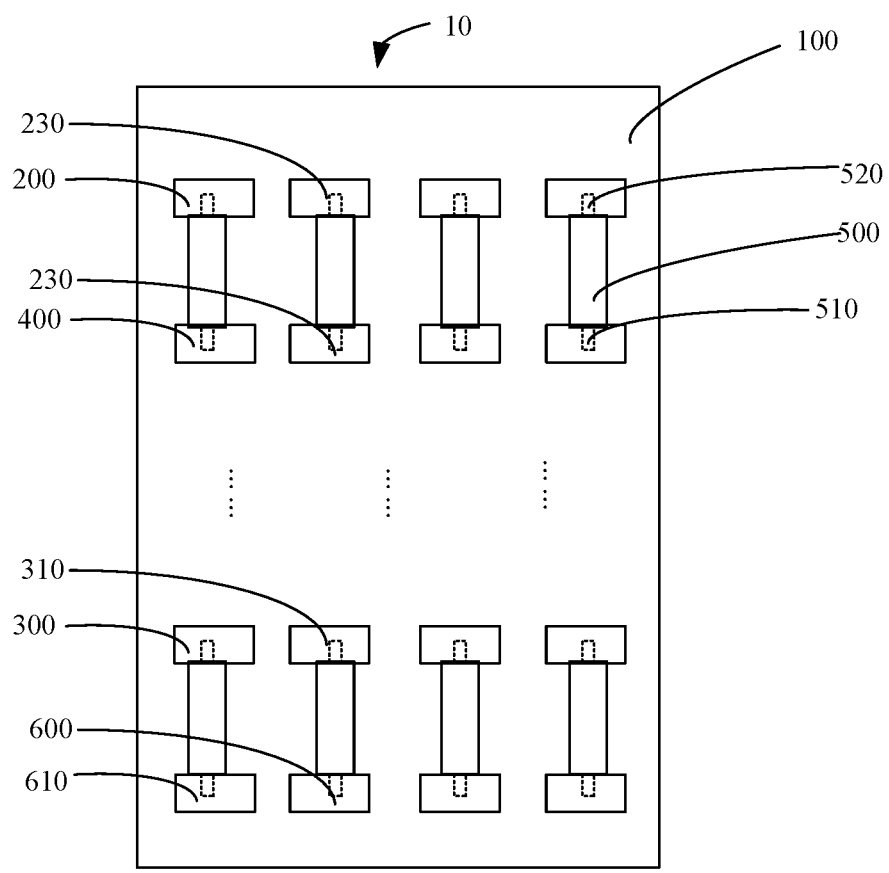
FIG. 5 is a fourth type of planar structural schematic diagram of the display panel provided by an embodiment of the present application.

Referring to FIG. 5, FIG. 5 is a fourth type of planar structural schematic diagram of the display panel provided by an embodiment of the present application. It should be noted that a difference between a fourth type of structure and the first type of structure is:

Both the first body electrode 200 and the second body electrode 400 include a plurality of electrode portions 230 arranged at intervals. The first conductive electrode 300 includes at least two of the first conductive patterns 310. The electrode portion 210 of the first body electrode 200 is provided with the first conductive patterns 310, and each two adjacent ones of the first conductive patterns 310 are spaced apart. The second conductive electrode 600 includes at least two of the second conductive patterns 610. The second conductive patterns 610 are disposed on the electrode portion 230 of the second body electrode 400, and each two adjacent ones of the second conductive patterns 610 are spaced apart. The electrode portion 210 of the first body electrode 200 and the electrode portion 230 of the second body electrode 400 are disposed opposite to each other. The first lead 510 is disposed between the first conductive pattern 310 and the electrode portion 230 of the first body electrode 200. The second lead 520 is disposed between the second conductive pattern 610 and the electrode portion 230 of the second body electrode 400.

The present application provides the display panel 10. The display panel 10 includes the substrate 100, the first body electrode 200, the first conductive electrode 300, the second body electrode 400, and the light-emitting device 500. The first body electrode 200 is disposed on the substrate 100. The first conductive electrode 300 is disposed on the first body electrode 200. The second body electrode 400 is disposed on the substrate 100. The second body electrode 400 is disposed opposite to the first body electrode 200. The light-emitting device 500 includes the first lead 510 and the second lead 520 disposed opposite to the first lead 510. The first lead 510 is disposed between the first conductive electrode 300 and the first body electrode 200, and the first lead 510 contacts the first conductive electrode 300 and the first body electrode 200. The second lead 520 is disposed on the second body electrode 400. Bonding the light-emitting device 500 to the first body electrode 200 through the first conductive electrode 300 enhances the contact between the light-emitting device 500 and the first body electrode 200, thereby enhancing the performance of the display panel 10.

Figure 6:
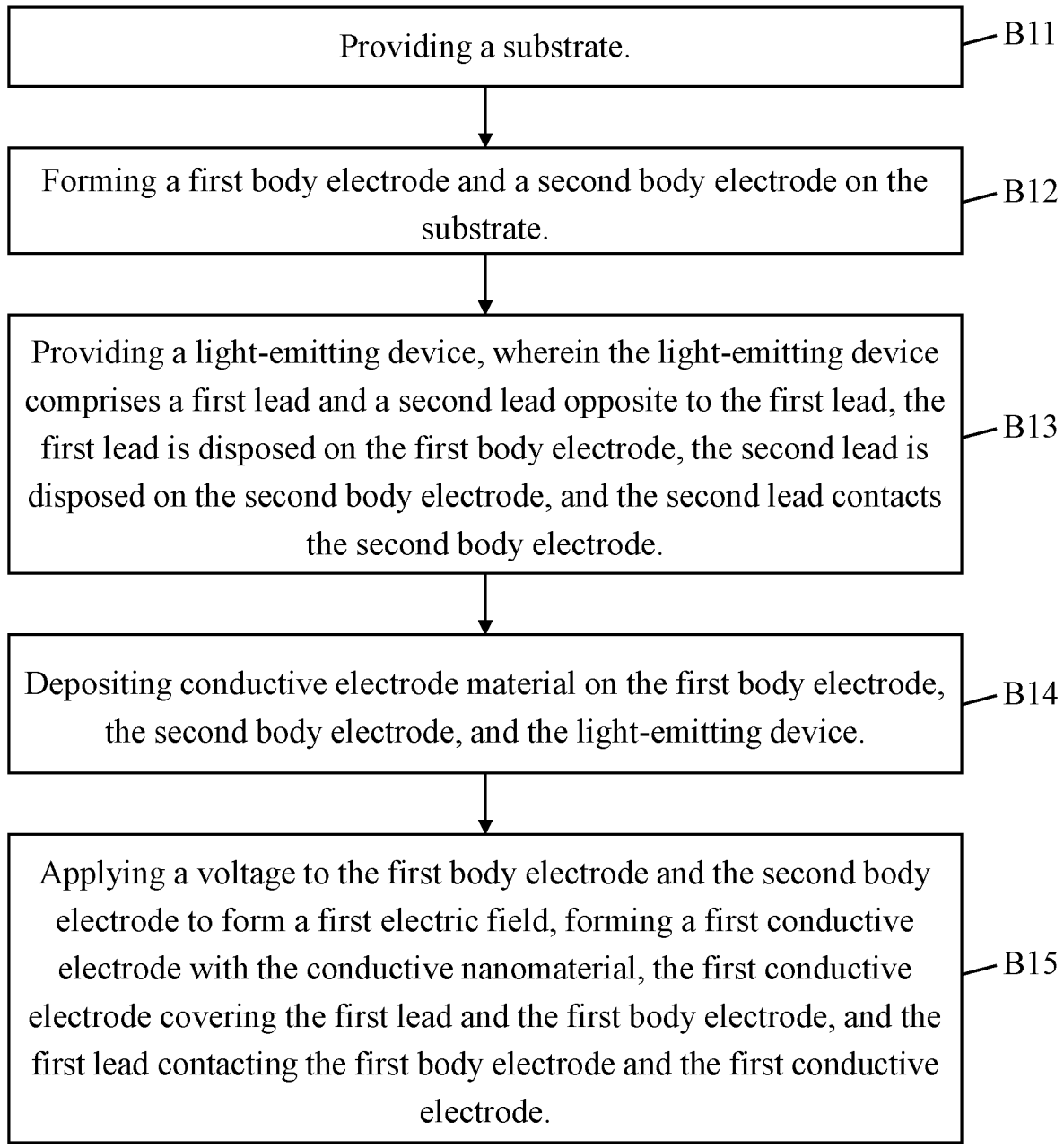
FIG. 6 is a flowchart of a manufacturing method of a display panel provided by an embodiment 1 of the present application.
Figure 7:
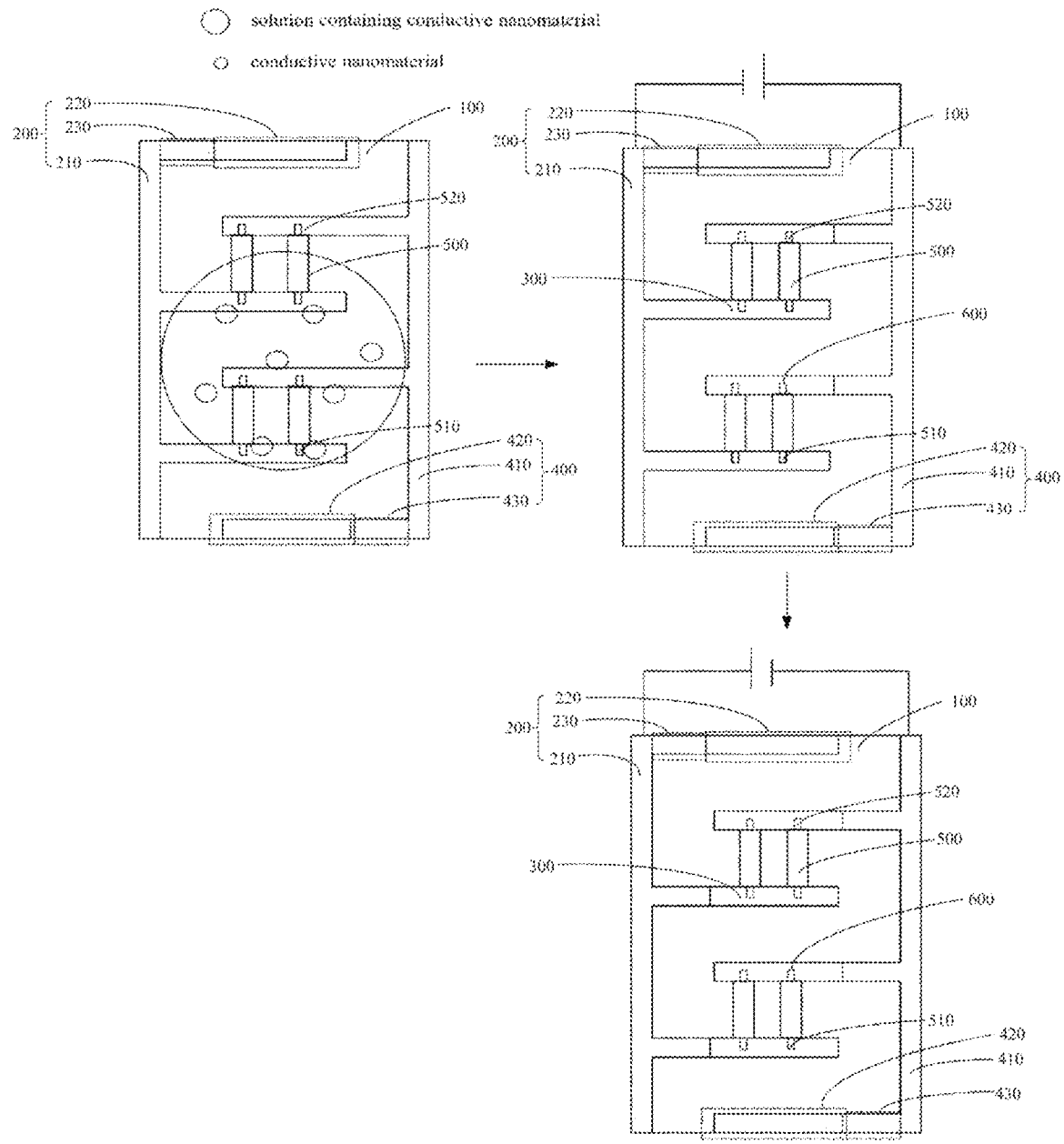
FIG. 7 is a structural flowchart of the manufacturing method of the display panel provided by an embodiment 1 of the present application.

References are made to FIG. 6 and FIG. 7. FIG. 6 is a flowchart of a manufacturing method of a display panel provided by an embodiment 1 of the present application. FIG. 7 is a structural flowchart of the manufacturing method of the display panel provided by an embodiment 1 of the present application, which includes:

step B11: providing a substrate;

step B12: forming a first body electrode and a second body electrode on the substrate;

step B13: providing a light-emitting device, wherein the light-emitting device includes a first lead and a second lead opposite to the first lead, the first lead is disposed on the first body electrode, the second lead is disposed on the second body electrode, and the second lead contacts the second body electrode;

step B14: depositing conductive electrode material on the first body electrode, the second body electrode, and the light-emitting device; and step B15: applying a voltage to the first body electrode and the second body electrode to form a first electric field, forming a first conductive electrode with the conductive nanomaterial, the first conductive electrode covering the first lead and the first body electrode, and the first lead contacting the first body electrode and the first conductive electrode.

The manufacturing method of the display panel provided in this embodiment will be described in detail below.

Embodiment 1

References are further made to FIG. 1, FIG. 6, and FIG. 7. The manufacturing method of a display panel 10 includes:

step B11: providing the substrate.

step B12: forming the first body electrode and the second body electrode on the substrate.

A first body electrode 200 includes a first electrode portion 210, a second electrode portion 220, and a first connecting portion 230 connected to the first electrode portion 210 and the second electrode portion 220. Both the first connecting portion 230 and the second electrode portion 220 are perpendicular to the first electrode portion 210.

A second body electrode 400 includes a third electrode portion 410, a fourth electrode portion 420, and a second connecting portion 430 connected to the third electrode portion 410 and the fourth electrode portion 420. Both the second connecting portion 430 and the third electrode portion 410 are perpendicular to the fourth electrode portion 420. The second electrode portion 220 and the fourth electrode portion 420 are positioned between the first electrode portion 210 and the third electrode portion 410. That is, the first body electrode 200 and the second body electrode 400 are interdigital electrodes.

step B13: providing the light-emitting device, wherein the light-emitting device includes the first lead and the second lead opposite to the first lead, the first lead is disposed on the first body electrode, the second lead is disposed on the second body electrode, and the second lead contacts the second body electrode.

Specifically, a first lead 510 is disposed on the second electrode portion 220. A second lead 520 is disposed on the fourth electrode portion 420.

step B14: depositing the conductive electrode material on the first body electrode, the second body electrode, and the light-emitting device.

Drop a solution containing a conductive nanomaterial on the first body electrode 200, the second body electrode 400, and the light-emitting device 500, or insert the first body electrode 200, the second body electrode 400, and the light-emitting device 500 into a solution containing the conductive nanomaterial. A concentration of the solution containing the conductive nanomaterial ranges from 1 mg/ml to 200 mg/ml. Specifically, the concentration of the solution containing the conductive nanomaterial can be 1 mg/ml, 20 mg/ml, 50 mg/ml, 80 mg/ml, 150 mg/ml, 180 mg/ml, 200 mg/ml, etc. In this embodiment, the concentration of the solution containing the conductive nanomaterial is 25 mg/ml. The conductive nanomaterial includes one or a combination of gold, silver, copper, iron, aluminum, polyaniline, polypyrrole, carbon nanotubes, or graphene.

step B15: applying a voltage to the first body electrode and the second body electrode to form the first electric field, forming the first conductive electrode with the conductive nanomaterial, the first conductive electrode covering the first lead and the first body electrode, and the first lead contacting the first body electrode and the first conductive electrode.

Specifically, the first body electrode 200 and the second body electrode 400 are positioned on a first plane 21. A negative electrode of a direct current (DC) power supply device is connected to the first body electrode 200, and a positive electrode of the DC power supply device is connected to the second body electrode 400. The body electrode 200 and the second body electrode 400 apply a voltage to form the first electric field. The first electric field is a horizontal electric field. The conductive nanomaterial forms the first conductive electrode 300. The first conductive electrode 300 covers the first lead 510 and the second electrode body 220. Furthermore, the positive electrode of the DC power supply device is connected to the first body electrode 200, and the negative electrode of the DC power supply device is connected to the second body electrode 400. A voltage is applied to the first body electrode 200 and the second body electrode 400 to form a second electric field. The nanomaterial forms the second conductive electrode 600. The second conductive electrode 600 covers the second lead 520 and the fourth electrode portion 420, and movement directions of the first electric field and the second electric field are opposite.

The voltage applied twice is greater than 0 volts and less than 1000 volts. A period for applying voltage twice ranges from 1 second to 100 seconds. Specifically, the voltage applied twice can be 0.01 volts, 10 volts, 80 volts, 200 volts, 355 volts, 600 volts, 800 volts, 1000 volts, etc. The period for applying voltage twice can be 1 second, 20 seconds, 50 seconds, 80 seconds, seconds, 100 seconds, etc. In this embodiment, the voltage applied twice is volts, and the period for applying the voltage twice is 70 seconds. Electric field intensities of the first electric field and the second electric field are both greater than 0 V/um and less than 50 V/um. Specifically, the electric field intensities of the first electric field and the second electric field are both 0.5 V/um, 5 V/um, 10 V/um, 20 V/um, 30 V/um, 45 V/um, or 50 V/um, etc. In this embodiment, the electric field intensities of the first electric field and the second electric field are both 35 V/um.

A vertical cross-sectional thickness H of the first conductive electrode 300 and the second conductive electrode 600 both range from 10 nanometers to 50 micrometers. Specifically, the vertical cross-sectional thickness H of the first conductive electrode 300 and the second conductive electrode 600 can be 10 nanometers, 100 nanometers, 500 nanometers, 900 nanometers, 1 micrometer, 10 micrometers, 30 micrometers, 40 micrometers, micrometers, etc. In this embodiment, the vertical cross-sectional thickness H of the first conductive electrode 300 and the second conductive electrode 600 is 5 micrometers.

In the present application, the concentration of the solution containing the conductive nanomaterial is defined to range from 1 mg per milliliter to 200 mg per milliliter, the applied voltage is defined to be greater than 0 volts and less than 1000 volts, the period for applying the voltage is defined to range from 1 second to 100 seconds, and the electric field intensities of the first electric field and the second electric field are both defined to be greater than 0 V/um and less than 50 V/um, so that the vertical cross-sectional thickness H of the first conductive electrode 300 and the second conductive electrode 600 both range from 10 nanometers to 50 micrometers, thereby enhancing a conductivity of the first conductive electrode 300 and the second conductive electrode 600, enhancing a display effect of the display panel 10, and reducing the cost.

In an embodiment, after step B15, the method further includes:

Performing an annealing process on the formed first conductive electrode 300 and the second conductive electrode 600 to remove organic components therein, so as to enhance the conductivity of the first conductive electrode 300 and the second conductive electrode 600.

The present application provides the manufacturing method of the display panel 10, which constructs the electric field through the existing first body electrode 200 and the second body electrode 400, and utilizes the electric field to drive the charged conductive nanomaterials to move and gather to the second electrode portion 220 and the fourth electrode portion 420 having opposite electrical property, thereby respectively obtaining the first conductive electrode 300 disposed on the second electrode portion 220 and the second conductive electrode 600 disposed on the fourth electrode portion 420 through manufacturing, and welding the light-emitting device 500 to the first body electrode 200 and the second body electrode 400, so as to enhance a conduction between the light-emitting device 500 and the first body electrode 200 and the second body electrode 400, without damaging a stability of the display panel 10, and enhancing the display effect of the display panel 10, which further enhances the performance of the display panel 10.

Embodiment 2

Figure 8:
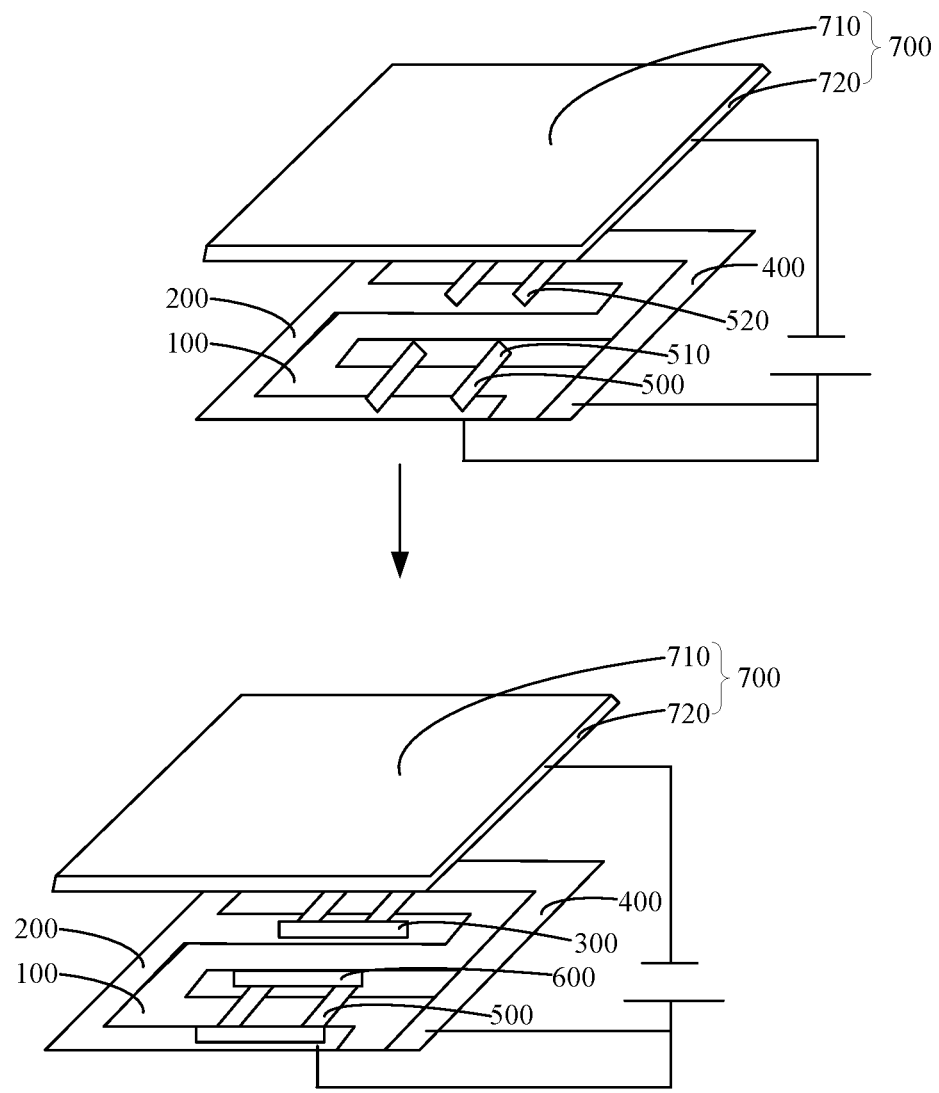
FIG. 8 is a structural flowchart of a manufacturing method of a display panel provided by an embodiment 2 of the present application.

References are made to FIG. 1 and FIG. 8. FIG. 8 is a structural flowchart of a manufacturing method of a display panel provided by an embodiment 2 of the present application. A difference between Embodiment 2 and Embodiment 1 is:

Provide a pair of substrates 700. The pair of substrates 700 include a base 710 and a pair of electrodes 720 disposed on the base 710. An orthographic projection of the pair of electrodes 720 on the substrate 100 covers an orthographic projection of the first body electrode 200 and the second body electrode 400 on the substrate 100. The first body electrode 200 and the second body electrode 400 are positioned on the first plane 21, the pair of electrodes 720 are positioned on the second plane 22, and the first plane 21 and the second plane 22 are disposed oppositely.

Furthermore, the positive electrode of the DC power supply device is connected to the first body electrode 200 and the second body electrode 400, and the negative electrode of the DC power supply device is connected to the pair of electrodes 720. A voltage is applied to form a third electric field. The third electric field is a vertical electric field. The conductive nanomaterial forms the first conductive electrode 300 and the second conductive electrode 600, and the first conductive electrode 300 covers the first lead 510 and the second electrode portion 220. The second conductive electrode 600 covers the second lead 520 and the fourth electrode portion 420. The applied voltage in "the third electric field formed by applying a voltage to the first body electrode 200, the second body electrode 400, and the pair of electrodes 720" is the same as the applied voltage in "the first electric field formed by applying a voltage to the first body electrode 200 and the second body electrode 400". The period for applying the voltage in "the third electric field formed by applying voltage to the first body electrode 200, the second body electrode 400, and the counter electrode 720" is the same as that in "the third electric field formed by applying a voltage to the first body electrode 200, the second body electrode 400, and the pair of electrodes 720" is the same as the period for applying the voltage in "the first electric field formed by applying a voltage to the first body electrode 200 and the second body electrode 400". The other steps are the same as in Embodiment 1, and will not be reiterated herein.

Embodiment 3

Figure 9:
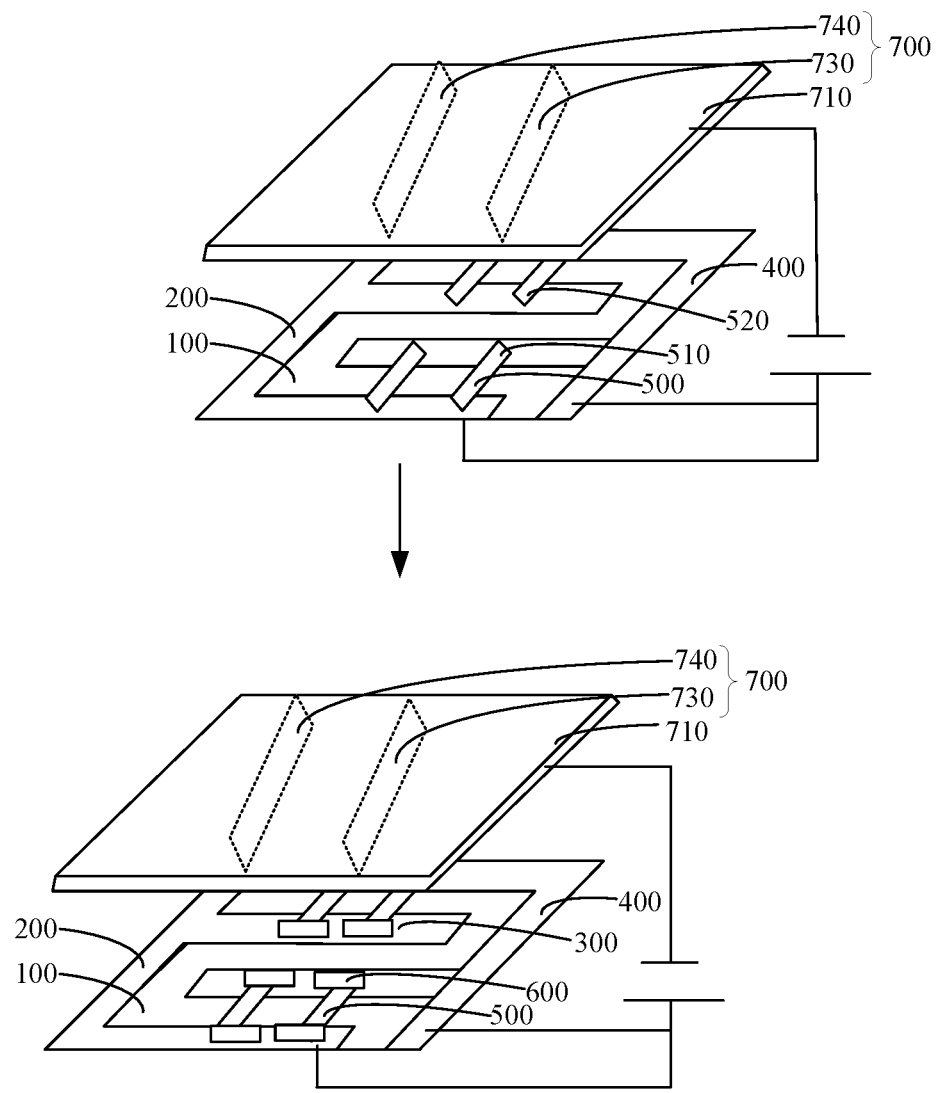
FIG. 9 is a structural flowchart of a manufacturing method of a display panel provided by an embodiment 3 of the present application.

References are made to FIG. 2 and FIG. 9. FIG. 9 is a structural flowchart of a manufacturing method of s display panel provided by an embodiment 3 of the present application. A difference between Embodiment 3 and Embodiment 1 is:

Provide the pair of substrates 700. The pair of substrates 700 include the base 710, an additional electrode 730, and a sacrificial electrode 740. The additional electrode 730 and the sacrificial electrode 740 are disposed on the base 710 in a same layer. The additional electrode 730 and the sacrificial electrode 740 are spaced apart from each other. The sacrificial electrode 740 is positioned on the second plane 22.

Furthermore, connect the positive electrode of the DC power supply device to the first body electrode 200 and the second body electrode 400, and connect the negative electrode of the DC power device to the additional electrode 730 and the sacrificial electrode 740; and apply a voltage to the electrode 400, the additional electrode 730, and the sacrificial electrode 740 to form the third electric field. The third electric field is a vertical electric field. The conductive nanomaterial forms the first conductive electrode 300 and the second conductive electrode 600. The first conductive electrode 300 includes at least two first conductive patterns 310. Each two adjacent ones of the first conductive patterns 310 are spaced apart. The first conductive patterns 310 are disposed on the second electrode portion 220. The second conductive electrode 600 includes at least two second conductive patterns 610. Each two adjacent ones of the second conductive patterns 610 are spaced apart. The second conductive patterns 610 are disposed on the fourth electrode portion 420. The applied voltage in "the third electric field formed by applying a voltage to the first body electrode 200, the second body electrode 400, the additional electrode 730, and the sacrificial electrode 740" is the same as the applied voltage in "the first electric field formed by applying a voltage to the first body electrode 200 and the second body electrode 400". The period for applying the voltage in "the third electric field formed by applying a voltage to the first body electrode 200, the second body electrode 400, the additional electrode 730, and the sacrificial electrode 740" is the same as the period for applying the voltage in "the first electric field formed by applying a voltage to the first body electrode 200 and the second body electrode 400".

An orthographic projection of the additional electrode 730 on the substrate 100 covers an orthographic projection of the first conductive electrode 300 on the substrate 100. An orthographic projection of the sacrificial electrode 740 on the substrate 100 covers an orthographic projection of the second conductive electrode 600 on the substrate 100. An orthographic projection of the first conductive pattern 310 on the substrate 100 is within an orthographic projection of the second electrode portion 220 on the substrate 100. An orthographic projection of the second conductive pattern 610 on the substrate 100 is within an orthographic projection of the fourth electrode portion 420 on the substrate 100.

The other steps are the same as in Embodiment 1, and will not be reiterated herein.

Embodiment 4

Reference is further made to FIG. 1. A difference between Embodiment 4 and Embodiment 1 is that the DC power supply device is changed to an alternating current (AC) power supply device. A direction of the electric field formed by the AC power supply device changes periodically. The other steps are the same as in Embodiment 1, and will not be reiterated herein.

The present application provides the manufacturing method of the display panel 10, which constructs the electric field through the existing first body electrode 200 and the second body electrode 400, and utilizes the electric field to drive the charged conductive nanomaterials to move and gather to the second electrode portion 220 and the fourth electrode portion 420 having opposite electrical property, thereby respectively obtaining the first conductive electrode 300 disposed on the second electrode portion 220 and the second conductive electrode 600 disposed on the fourth electrode portion 420 through manufacturing, and welding the light-emitting device 500 to the first body electrode 200 and the second body electrode 400, so as to enhance a conduction between the light-emitting device 500 and the first body electrode 200 and the second body electrode 400, without damaging a stability of the display panel 10, and enhancing the display effect of the display panel 10, which further enhances the performance of the display panel 10.

The present application further provides a bonding structure. The bonding structure includes a substrate, a first body electrode, a first conductive electrode, a second body electrode, and a component to be bonded. The first body electrode is disposed on the substrate, the first conductive electrode is disposed on the first body electrode. The second body electrode is disposed on the substrate. The second body electrode is disposed opposite to the first body electrode. The component to be bonded includes a first lead and a second lead arranged opposite to the first lead. The first lead is disposed between the first conductive electrode and the first body electrode. The second lead is disposed on the second body electrode.

The bonding structure can be adapted to bonding requirements in devices such as micro light-emitting diodes, micro-nano light-emitting diodes, sensors, solar cells, logic circuits, field effect transistors, circuit repairs, etc.

The present application provides the bonding structure. The bonding structure includes the substrate, the first body electrode, the first conductive electrode, the second body electrode, and the component to be bonded. The first body electrode is disposed on the substrate, the first conductive electrode is disposed on the first body electrode. The second body electrode is disposed on the substrate. The second body electrode is disposed opposite to the first body electrode. The component to be bonded includes the first lead and the second lead arranged opposite to the first lead. The first lead is disposed between the first conductive electrode and the first body electrode. The second lead is disposed on the second body electrode. The component to be bonded being bonded to the first body electrode via the first conductive electrode enhances a contact between the component to be bonded and the first body electrode, thereby enhancing a performance of the bonding structure.

Figure 10:
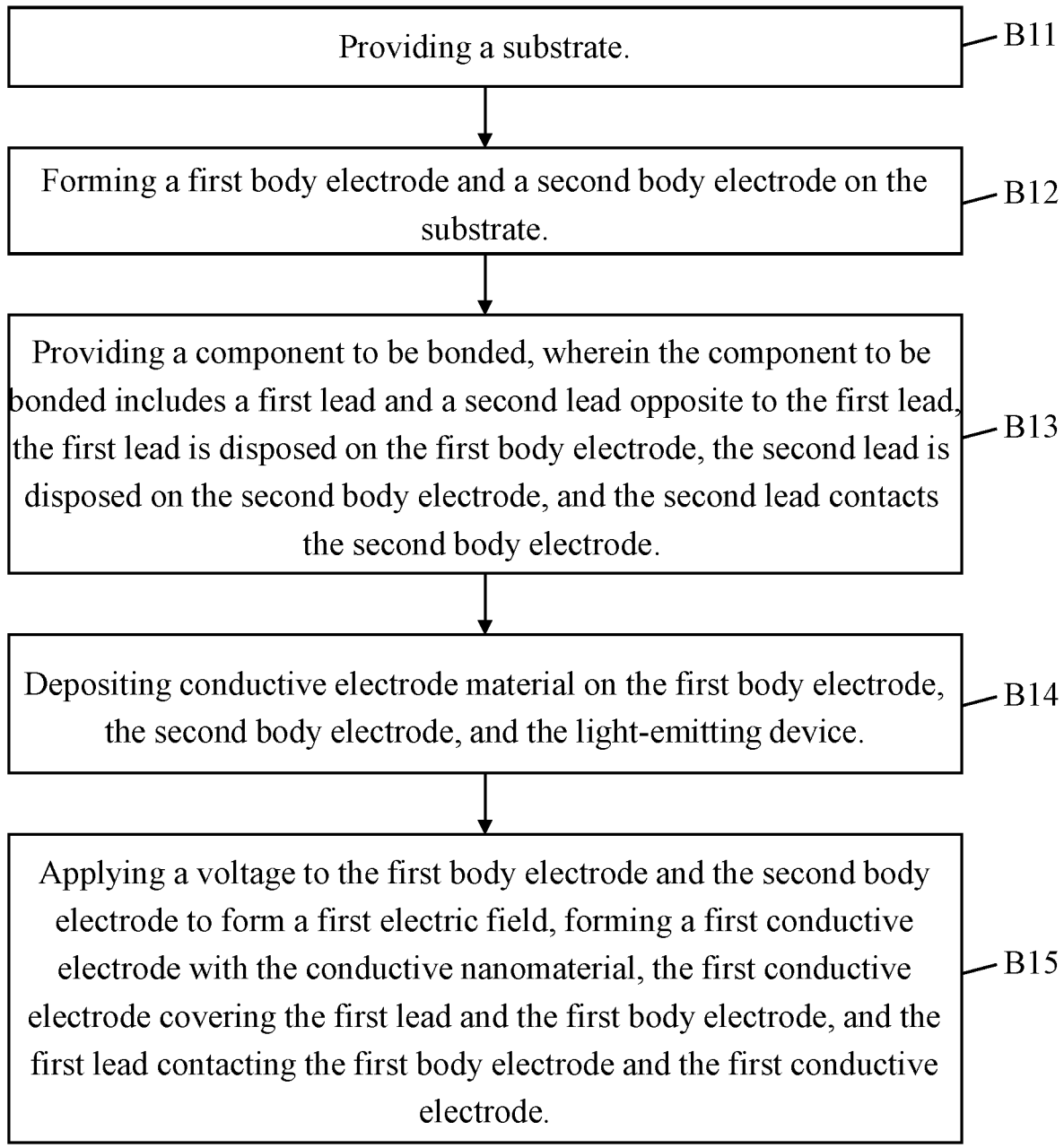
FIG. 10 is a structural flowchart of a bonding structure provided by an embodiment of the present application.

Referring to FIG. 10, FIG. 10 is a structural flowchart of a bonding structure provided by an embodiment of the present application. The present application further provides a manufacturing method of the bonding structure, including:

step B11: providing a substrate;

step B12: forming a first body electrode and a second body electrode on the substrate;

step B13: providing a component to be bonded, wherein the component to be bonded includes a first lead and a second lead opposite to the first lead, the first lead is disposed on the first body electrode, the second lead is disposed on the second body electrode, and the second lead contacts the second body electrode;

step B14: depositing conductive electrode material on the first body electrode, the second body electrode, and the light-emitting device; and step B15: applying a voltage to the first body electrode and the second body electrode to form a first electric field, forming a first conductive electrode with the conductive nanomaterial, the first conductive electrode covering the first lead and the first body electrode, and the first lead contacting the first body electrode and the first conductive electrode.

The bonding structure can be adapted to bonding requirements in devices such as micro light-emitting diodes, micro-nano light-emitting diodes, solar cells, logic circuits, field effect transistors, circuit repairs, etc.

The present application provides the manufacturing method of the bonding structure, including: providing the substrate; forming the first body electrode and the second body electrode on the substrate; providing the component to be bonded, wherein the component to be bonded includes the first lead and the second lead opposite to the first lead, the first lead is disposed on the first body electrode, the second lead is disposed on the second body electrode, and the second lead contacts the second body electrode; depositing conductive electrode material on the first body electrode, the second body electrode, and the light-emitting device; and applying a voltage to the first body electrode and the second body electrode to form the first electric field, forming the first conductive electrode with the conductive nanomaterial, the first conductive electrode covering the first lead and the first body electrode, and the first lead contacting the first body electrode and the first conductive electrode. The component to be bonded being bonded to the first body electrode via the first conductive electrode enhances a contact between the component to be bonded and the first body electrode, thereby enhancing a performance of the bonding structure.

The present application provides the display panel and the manufacturing method thereof, the bonding structure and the manufacturing method thereof. The display panel 10 includes the substrate 100, the first body electrode 200, the first conductive electrode 300, the second body electrode 400, and the light-emitting device 500. The first body electrode 200 is disposed on the substrate 100. The first conductive electrode 300 is disposed on the first body electrode 200. The second body electrode 400 is disposed on the substrate 100. The second body electrode 400 is disposed opposite to the first body electrode 200. The light-emitting device 500 includes the first lead 510 and the second lead 520 disposed opposite to the first lead 510. The first lead 510 is disposed between the first conductive electrode 300 and the first body electrode 200, and the first lead 510 contacts the first conductive electrode 300 and the first body electrode 200. The second lead 520 is disposed on the second body electrode 400. Bonding the light-emitting device 500 to the first body electrode 200 through the first conductive electrode 300 enhances the contact between the light-emitting device 500 and the first body electrode 200, thereby enhancing the performance of the display panel 10.

The display panel and the manufacturing method thereof, the bonding structure and the manufacturing method thereof provided by the present application is described in detail above, the specific examples of this document are used to explain principles and embodiments of the present application, and the description of embodiments above is only for helping to understand the present application. Meanwhile, those skilled in the art will be able to change the specific embodiments and the scope of the present application according to the idea of the present application. In the above, the content of the specification should not be construed as limiting the present application. Above all, the content of the specification should not be the limitation of the present application.

What is claimed is:
1. A display panel, comprising:
a substrate;
a first body electrode disposed on the substrate;
a first conductive electrode disposed on the first body electrode;

a second body electrode disposed on the substrate and opposite to the first body electrode;

a light-emitting device comprising a first lead and a second lead opposite to the first lead, wherein the first lead is disposed between the first conductive electrode and the first body electrode and contacts the first body electrode and the first conductive electrode, and the second lead is disposed on the second body electrode and contacts the second body electrode;

wherein the first conductive electrode comprises at least two first conductive patterns and a third conductive pattern, two adjacent first conductive patterns are spaced apart, and the third conductive pattern is positioned between the two adjacent first conductive patterns; wherein ends of the third conductive pattern are connected with the two adjacent first conductive patterns, respectively, a width of one of the first conductive patterns is greater than a width of the third conductive pattern, and the one of the first conductive patterns is connected to the first lead.

2. The display panel according to claim 1, further comprising a second conductive electrode disposed on the second body electrode;

wherein the second lead of the light-emitting device is disposed between the second body electrode and the second conductive electrode and contacts the second body electrode and the second conductive electrode.

3. The display panel according to claim 2, wherein the first body electrode comprises a first electrode portion and a second electrode portion connected to the first electrode portion, and the first conductive electrode is disposed on the second electrode portion;

the second body electrode comprises a third electrode portion and a fourth electrode portion connected to the third electrode portion, and the second conductive electrode is disposed on the fourth electrode portion;

the first electrode portion is opposite to the third electrode portion, the second electrode portion and the fourth electrode portion are disposed between the first electrode portion and the third electrode portion; and the first lead is disposed between the second electrode portion and the first conductive electrode, and the second lead is disposed between the fourth electrode portion and the second conductive electrode.

4. The display panel according to claim 2, wherein the second conductive electrode comprises at least two second conductive patterns, two adjacent second conductive patterns are spaced apart, one of the second conductive patterns is connected to the second lead.

5. The display panel according to claim 4, wherein the second conductive electrode further comprises a fourth conductive pattern positioned between the two adjacent second conductive patterns, and a width of the one of the second conductive patterns is greater than a width of the fourth conductive pattern.

6. The display panel according to claim 4, wherein the first body electrode and the second body electrode comprise a plurality of electrode portions arranged at intervals, one of the first conductive patterns is disposed on one of the electrode portions of the first body electrode, the second body electrode comprises a plurality of third electrode portions and a plurality of fourth electrode portions arranged at intervals, one of the second conductive patterns is disposed on one of the electrode portions of the second body electrode, and the electrode portions of the first body electrode are opposite to the electrode portions of the second body electrode.

7. The display panel according to claim 2, wherein the first conductive electrode and the second conductive electrode are conductive films, and one of the conductive films comprises a conductive nanomaterial.

8. The display panel according to claim 7, wherein the conductive nanomaterial comprises one or a combination of gold, silver, copper, iron, aluminum, polyaniline, polypyrrole, carbon nanotubes, or graphene.

9. The display panel according to claim 2, wherein vertical cross-section thicknesses of the first conductive electrode and the second conductive electrode range from 10 nanometers to 50 micrometers.

10. The display panel according to claim 2, wherein a distance between the first body electrode provided with the first conductive electrode and the second body electrode provided with the second conductive electrode is less than 100 nanometers.

11. A manufacturing method of a display panel, comprising:

providing a substrate;

forming a first body electrode and a second body electrode on the substrate;

providing a light-emitting device, wherein the light-emitting device comprises a first lead and a second lead opposite to the first lead, the first lead is disposed on the first body electrode, the second lead is disposed on the second body electrode, and the second lead contacts the second body electrode;

depositing conductive electrode material on the first body electrode, the second body electrode, and the light-emitting device, wherein the conductive electrode material comprises a conductive nanomaterial; and applying a voltage to the first body electrode and the second body electrode to form a first electric field, forming a first conductive electrode with the conductive nanomaterial, the first conductive electrode covering the first lead and the first body electrode, and the first lead contacting the first body electrode and the first conductive electrode;

wherein the first conductive electrode comprises at least two first conductive patterns and a third conductive pattern, two adjacent first conductive patterns are spaced apart, and the third conductive pattern is positioned between the two adjacent first conductive patterns; wherein ends of the third conductive pattern are connected with the two adjacent first conductive patterns, respectively, a width of one of the first conductive patterns is greater than a width of the third conductive pattern, and the one of the first conductive patterns is connected to the first lead.

12. The manufacturing method of the display panel according to claim 11, wherein the first body electrode and the second body electrode are positioned on a first plane; and the step of applying the voltage to the first body electrode and the second body electrode to form the first electric field, forming the first conductive electrode with the conductive nanomaterial, the first conductive electrode covering the first lead and the first body electrode, and the first lead contacting the first body electrode and the first conductive electrode comprises:

applying the voltage to the first body electrode and the second body electrode to form a second electric field, forming a second conductive electrode with the conductive nanomaterial, and the second conductive electrode covering the second lead and the second body electrode, wherein directions of the first electric field and the second electric field are opposite.

13. The manufacturing method of the display panel according to claim 11, wherein the step of applying the voltage to the first body electrode and the second body electrode to form the first electric field, forming the first conductive electrode with the conductive nanomaterial, the first conductive electrode covering the first lead and the first body electrode, and the first lead contacting the first body electrode and the first conductive electrode comprises:

provide a pair of electrodes, wherein an orthographic projection of the pair of electrodes on the substrate covers an orthographic projection of the first body electrode and the second body electrode on the substrate, the first body electrode and the second body electrode are positioned on a first plane, the pair of electrodes are positioned on a second plane, and the first plane and the second plane are opposite; and applying the voltage to the first body electrode, the second body electrode, and the pair of electrodes to form a third electric field, forming the first conductive electrode and a second conductive electrode with the conductive nanomaterial, the first conductive electrode covering the first lead and the first body electrode, and the second conductive electrode covering the second lead and the second body electrode.

14. The manufacturing method of the display panel according to claim 13, wherein the step of applying the voltage to the first body electrode, the second body electrode, and the pair of electrodes to form the third electric field, forming the first conductive electrode and the second conductive electrode with the conductive nanomaterial, the first conductive electrode covering the first lead and the first body electrode, and the second conductive electrode covering the second lead and the second body electrode comprises:

providing an additional electrode and a sacrificial electrode, wherein the additional electrode and the sacrificial electrode are positioned on the second plane, and the additional electrode and the sacrificial electrode are spaced apart;

applying the voltage to the first body electrode, the second body electrode, the additional electrode, and the sacrificial electrode to form the third electric field, forming the first conductive electrode and the second conductive electrode with the conductive nanomaterial, wherein an orthographic projection of the additional electrode on the substrate covers an orthographic projection of the first conductive electrode on the substrate, and an orthographic projection of the sacrificial electrode on the substrate covers an orthographic projection of the second conductive electrode on the substrate.

15. The manufacturing method of the display panel according to claim 11, wherein a concentration of a solution containing the conductive nanomaterial ranges from 1 milligram per milliliter to 200 milligrams per milliliter.

16. The manufacturing method of the display panel according to claim 11, wherein an electric field intensity of the first electric field is greater than 0 V/um and less than 50 V/um.

17. The manufacturing method of the display panel according to claim 11, wherein a time of applying the voltage ranges from 1 second to 100 seconds.

18. The manufacturing method of the display panel according to claim 11, wherein after the step of applying the voltage to the first body electrode and the second body electrode to form the first electric field and forming the first conductive electrode with the conductive nanomaterial, the manufacturing method of the display panel further comprises:

annealing the first conductive electrode.

19. The manufacturing method of the display panel according to claim 12, wherein after the step of applying the voltage to the first body electrode and the second body electrode to form the second electric field, forming the second conductive electrode with the conductive nanomaterial, the manufacturing method of the display panel further comprises:

annealing the second conductive electrode.

20. A bonding structure, comprises:

a substrate;

a first body electrode disposed on the substrate;

a first conductive electrode disposed on the first body electrode;

a second body electrode disposed on the substrate and opposite to the first body electrode; and a component to be bonded comprising a first lead and a second lead opposite to the first lead, wherein the first lead is disposed between the first conductive electrode and the first body electrode and contacts the first body electrode and the first conductive electrode, and the second lead is disposed on the second body electrode and contacts the second body electrode;

wherein the first conductive electrode comprises at least two first conductive patterns and a third conductive pattern, two adjacent first conductive patterns are spaced apart, and the third conductive pattern is positioned between the two adjacent first conductive patterns; wherein ends of the third conductive pattern are connected with the two adjacent first conductive patterns, respectively, a width of one of the first conductive patterns is greater than a width of the third conductive pattern, and the one of the first conductive patterns is connected to the first lead.

* * * * *